United States Patent [19]

Earle

[11] Patent Number: 5,006,190
[45] Date of Patent: Apr. 9, 1991

[54] FILM REMOVAL METHOD

[75] Inventor: Richard W. Earle, Phoenix, Ariz.

[73] Assignee: Motorola, Inc., Schaumburg, Ill.

[21] Appl. No.: 474,894

[22] Filed: Feb. 5, 1990

[51] Int. Cl.$^5$ ............................................. B32B 31/16
[52] U.S. Cl. .................................... 156/247; 156/344; 156/584
[58] Field of Search ............... 156/247, 285, 344, 584; 226/5, 96; 271/900

[56]       References Cited
        U.S. PATENT DOCUMENTS

| 4,285,759 | 8/1981 | Allen et al. | 156/344 X |
| 4,508,589 | 4/1985 | Tarui et al. | 156/584 |
| 4,631,103 | 12/1986 | Ametani | 156/344 X |

Primary Examiner—Michael W. Ball
Assistant Examiner—Mark A. Osele
Attorney, Agent, or Firm—Harry A. Wolin

[57]              ABSTRACT

A method of removing an adhered film from a workpiece includes holding a workpiece having a film to be removed adhered thereto in a stationary position. An adhesive is applied along a length of the film that is less than the length of the entire film. Once the adhesive has been applied, it is pulled away from the workpiece so that the film separates from a portion of the workpiece and may then be completely removed therefrom.

1 Claim, 1 Drawing Sheet

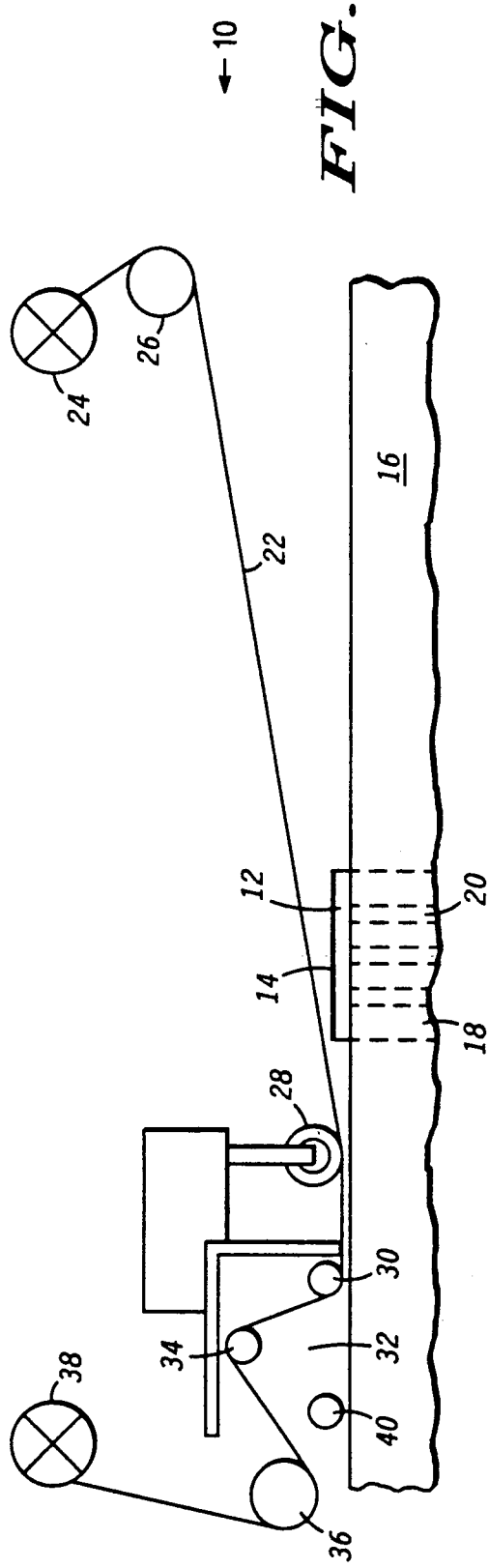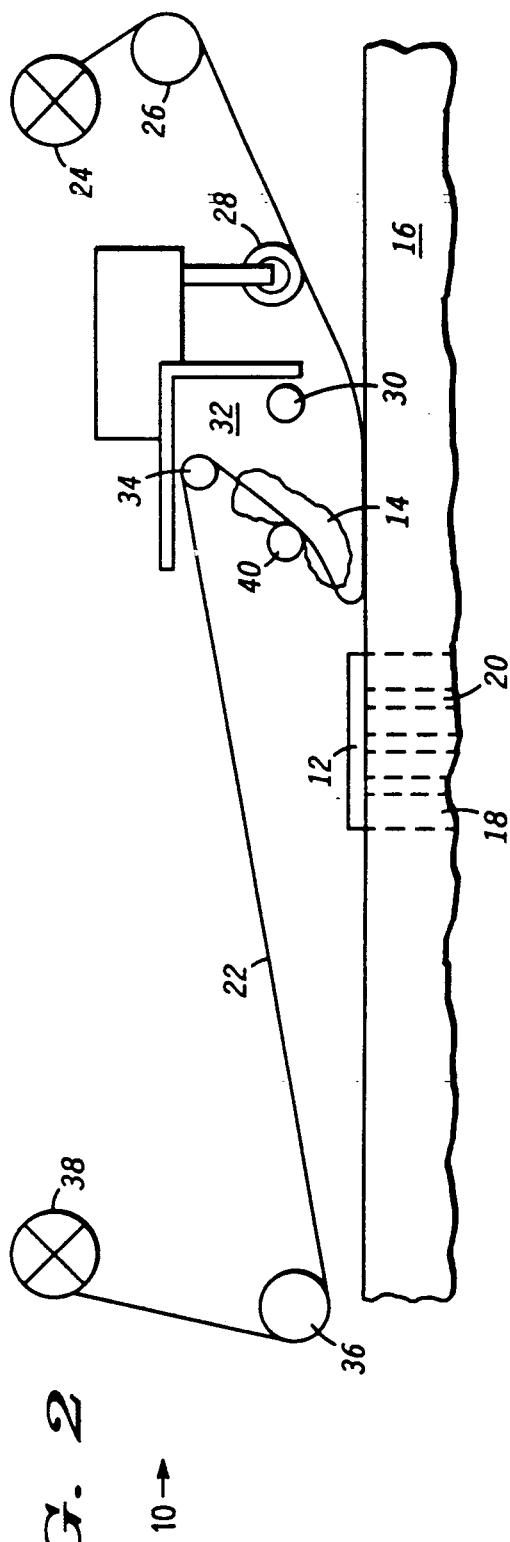

FILM REMOVAL METHOD

BACKGROUND OF THE INVENTION

This invention relates, in general, to a method of removing an adhered film from a workpiece and more particularly to a method of removing an adhered protective film from a semiconductor wafer.

In arts including the semiconductor, optics and decal arts, adhesive films, spin-on polymers and other coatings are often employed for protection and other reasons. One example of the use of a protective film occurs during the backgrind process for semiconductor wafers. Following the processing of semiconductor devices on a wafer, the wafer goes through a backgrind process where the backside of the wafer is thinned using a porous slurry or a diamond wheel. During this process, it is necessary to protect the finished semiconductor devices on the frontside of the wafer so that they are not damaged or contaminated by particulates. It is common to apply an adhesive film to the frontside of the wafer for protection of the finished devices thereon. When the backgrind process is completed, it is necessary to remove the protective film so that the devices on the wafer may be furtner prepared for packaging.

Protective tape removal machines are well known in the art. One such machine initially takes a wafer having a protective film adhered thereto from a wafer boat and transports it into a mechanical preparation tool. The mechanical preparation tool includes screws which are mechanically drawn across the edge of the protective film to peel it back from the wafer edge and initiate the delamination process. The screws create stress on the wafer which often causes microcracks to occur along grain boundaries of the wafer which may cause the wafer to break. Further, the screws often scratch the wafer and create unwanted particulates that may contaminate the device.

Once the wafer has been subjected to the mechanical preparation tool which initiates the delamination process, it is transported through a series of rollers which apply an adhesive tape to the film disposed thereon. Often, the adhesive from the tape sticks to the bottom rollers and causes the wafer to stick thereto. Even slight adhesion of the wafer to the roller causes the wafer to follow the shape of the roller (bend). This often causes cracks to occur in the wafer due to the extra stress caused by the rollers. This is especially detrimental when the wafer has previously been stressed along a grain boundary. In addition to the stress caused by the adhesive on the rollers, the rollers inherently apply additional stress to the wafer as it moves therethrough.

As the wafer moves through to the rollers, tape is applied along the entire length of the protective film. Following the application of the adhesive tape, the wafer is held in a stationary position by a vacuum chuck or the like. Once wafer is held stationary, the tape is pulled backwards at 180 degrees to the wafer surface until the protective film is completely removed. Additional stress acts upon the wafer at this point because of the tape being adhered to the film along its entire length. This often causes cracks in the wafers, especially at points where it has been previously weakened by earlier delamination steps.

Accordingly, it would be highly desirable to have a method of removing an adhered film from a workpiece that does not scratch the workpiece or cause stress to act thereupon.

SUMMARY OF THE INVENTION

Accordingly, it is an object of the present invention to provide a method of removing an adhered film from a workpiece that does not scratch the workpiece itself.

Another object of the present invention is to provide a method of removing an adhered film from a workpiece that does not create stress which acts upon the workpiece.

It is an additional object of the present invention to provide a method of removing adhered films from a workpiece that may allow for reduced equipment complexity.

Yet a further object of the present invention is to provide a method of removing an adhered film from a workpiece that allows for higher throughput.

Even another object of the present invention is to provide a method of removing an adhered film from a workpiece which results in reduced scrapping of workpieces.

The foregoing and other objects and advantages are achieved in the present invention by one embodiment in which, as a part thereof, includes holding a wafer having a film to be removed adhered thereto in a stationary position and applying an adhesive tape along a length of the film wherein the length is in the range of 5 to 50 percent of the entire length of the film. Following the application of the adhesive tape, the adhesive tape is pulled away from the wafer so that the film separates from a portion of a wafer. The film may then be completely removed therefrom.

A more complete understanding of the present invention can be attained by considering the following detailed description in conjunction with the accompanying drawings.

BRIEF DESCRIPTION OF THE DRAWINGS

FIG. 1 is a reduced schematic side-view of a film removal machine having a wafer disposed thereon prior to film removal; and FIG. 2 is a reduced schematic side-view of the film removal machine of FIG. 1 having a wafer disposed thereon subsequent to film removal.

DETAILED DESCRIPTION OF THE INVENTION

FIG. 1 is a reduced schematic side-view of a film removal machine 10 having a wafer 12 including a film 14 to be removed disposed thereon prior to the removal of film 14. FIG. 2 is a reduced schematic side-view of film removal machine 10 having wafer 12 disposed thereon subsequent to the removal of film 14 from wafer 12. It should be understood that FIGS. 1 and 2 are merely representations of a film removal machine and are used merely to illustrate the present invention. Only a limited number of parts of film removal machine 10 are depicted in FIGS. 1 and 2 and many mechanical parts have been omitted therefrom to avoid making the drawings unduly complex. Further, it should be understood that FIGS. 1 and 2 are not necessarily drawn to scale.

Film removal machine 10 includes a base portion 16. Base portion 16 may include conveyor means or the like (not shown) to transport a workpiece, wafer 12 herein. Base portion 16 further includes a vacuum stage area 18 on which wafer 12 is held stationary. Vacuum stage area 18 includes vacuum columns 20 represented by the dotted lines. Vacuum columns 20 are openings extending through base portion 16 which are coupled to a vacuum source (not shown) and allow wafer 12 to be held stationary on vacuum stage area 18.

Film removal machine 10 also includes a tape mechanism through which an adhesive tape 22, having a lesser width than wafer 12 in this embodiment, is guided. Prior to the removal of film 14 as shown in FIG. 1, tape 22 extends from a tape feed reel 24 around guide means 26. From guide means 26, tape 22 extends over wafer 12 and then beneath roller 28. Tape 22 further is guided beneath front bottom roller 30 of tape pulling assembly 32. It should be understood that front bottom roller 30 as well as top roller 34 and back bottom roller 40 (both to be discussed presently) of tape pulling assembly 32 may or may not be rotatably mounted. Front bottom roller 30 serves to keep tape 22 essentially coplanar with roller 28 prior to the application of tape 22 to film 14. From front bottom roller 30, tape 22 extends over top roller 34 of tape pulling assembly 32 and then exits tape pulling assembly 32 and is deployed about guide means 36 which enables tape 22 to be easily fed into a take-up reel 38.

To initiate the removal of film 14 from wafer 12, a predetermined amount of tape is fed through the tape mechanism and reels 24 and 38 are locked. Roller 28 then rolls over a length of film 14 adhering tape 22 thereto. The length of film 14 that roller 28 adheres tape 22 to is in the range of 5 to 50 percent of the entire length of film 14. As shown therein, the entire length of film 14 is equal to the entire length of wafer 12 although it should be understood that it does not have to be. In a preferred embodiment, the length of film 14 on which tape 22 is adhered is approximately equal to 20 percent of the entire length of film 14.

To properly adhere tape 22 to film 14, roller 28 may be required to roll over the length of film 14 to which tape 22 is adhered a number of times. Once roller 28 has properly adhered tape 22 to the desired length of film 14, it is lifted to a level above film 14 so that it may proceed over wafer 12 without further adhering tape 22 to film 14. At that point, tape pulling assembly 32 is moving in conjunction with roller 28. As tape pulling assembly 32 moves toward wafer 12, front bottom roller 30 moves away from tape 22 which is then encountered by back bottom roller 40 of tape pulling assembly 32. As tape pulling, assembly 32 continues beyond wafer 12, back bottom roller 40 by engaging tape 22 causes tape 22 to separate film 14 from wafer 12 along the length of film 14 where tape 22 is adhered. It should be understood that there must be a stronger adhesion between tape 22 and film 14 than between film 14 and wafer 12 in order for film 14 to be adequately removed from wafer 12 in the aforementioned manner.

As tape pulling assembly 32 pulls tape 22 to beyond the length of film 14 where tape 22 is adhered, the partial removal of film 14 from wafer 12 along the adhered length will cause film 14 to continue its delamination from wafer without tape 22 actually being adhered to the latter potion of film 14. This prevents tape 22 from causing additional stress to act on wafer 12. It should be understood that as tape pulling assembly 32 moves over wafer 12, front bottom roller 30 and back bottom arm 40 are at a height above the top surface of film 14 and do not actually encounter film 14 until it is completely removed from wafer 12. Once film 14 has been completely removed from wafer 12, the portion of tape 22 having film 14 adhered thereto is taken in by take-up reel 38 and tape pulling assembly 32 and roller 28 may be returned to their initial position. Tape feed reel 24 will then feed a fresh amount of tape 22 so that the process may again be performed on another wafer.

Thus it is apparent that there has been provided, in accordance with the invention, an improved method of removing an adhered film from a workpiece which meets the objects and advantages set forth above. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A method of removing an adhered film from a wafer, said method comprising the steps of:
    placing a wafer having a film to be removed adhered thereto on a vacuum stage to hold said wafer in a stationary position;
    applying an adhesive tape along a length of the non-adhered surface of said film, said tape being applied by applying means which apply pressure to said tape along said length which is in the range of 5 to 50 percent of the entire length of said film;
    lifting said applying means away from said film following the application of said adhesive tape; and
    pulling said tape with pulling means so that said film initially separates from a portion of said wafer and is then completely removed therefrom, said pulling means comprising a top roller, a front bottom roller and a back bottom roller, said top roller serving to guide tape into a tape take-up reel, said front bottom roller serving to hold said tape approximately planar to rolling means so that it will apply said tape along the length and said back bottom roller serving to pull said tape following its adherence to said film.

* * * * *